United States Patent [19]

Kobayashi

[11] Patent Number: 5,327,388
[45] Date of Patent: Jul. 5, 1994

[54] SEMICONDUCTOR MEMORY DEVICE

[75] Inventor: Yasuo Kobayashi, Tokyo, Japan

[73] Assignee: NEC Corporation, Tokyo, Japan

[21] Appl. No.: 952,977

[22] Filed: Sep. 29, 1992

[30] Foreign Application Priority Data

Oct. 15, 1991 [JP] Japan .................................. 3-265797

[51] Int. Cl.⁵ .............................................. G11C 7/00
[52] U.S. Cl. ..................................... 365/226; 365/201
[58] Field of Search ............... 365/226, 227, 201, 224, 365/242

[56] References Cited

U.S. PATENT DOCUMENTS

| | | | |
|---|---|---|---|
| 4,780,854 | 10/1988 | Watanabe et al. | 365/226 |
| 4,862,413 | 8/1989 | Hashimoto et al. | 365/226 |
| 5,121,007 | 6/1992 | Aizaui | 365/226 |

FOREIGN PATENT DOCUMENTS 61-214772 9/1986 Japan .
2-40195 2/1990 Japan .

Primary Examiner—Eugene R. LaRoche
Assistant Examiner—Tan Nguyen
Attorney, Agent, or Firm—Sughrue, Mion, Zinn, Macpeak & Seas

[57] ABSTRACT

A semiconductor memory device with a power source voltage step-down circuit which generates a stepped-down voltage from electric power supplied from outside and supplies this stepped-down voltage to a memory cell array and peripheral circuits. Current switching device interposed in a circuit or circuits of the semiconductor memory device other than the memory cell array and a switch controlling signal generating means for generating a controlling signal in response to a signal from the outside are provided. The current switching device performs switching of current to flow through the circuit in response to a controlling signal.

8 Claims, 9 Drawing Sheets

SEMICONDUCTOR MEMORY DEVICE

BACKGROUND OF THE INVENTION

1. Field of the Invention

This invention relates to a semiconductor memory device, and more particularly to a semiconductor memory device wherein the internal memory cell array and the peripheral circuit operate at a voltage lower than a power source voltage supplied from the outside and wherein a power source step-down circuit is provided for generating a voltage to be supplied to the memory cell array and the peripheral circuit.

2. Description of the Prior Art

In conventional SRAMs (static random access memories) of the CMOS (complementary metal oxide semiconductor) configuration, most of power source current upon waiting for circuit operation is consumed by an internal memory cell array. Current consumed by peripheral circuits other than the memory cell array such as an address decoder circuit and an operation controlling circuit is so low due to the low current consumption characteristic of the CMOS transistor itself that it can be ignored. For example, in an SRAM having a storage capacity of 1 Mbits, the current consumed by the entire memory cells for 1 Mbits is about 1 μA, while the current consumed by the entire peripheral circuits upon waiting is about 0.05 μA.

In recent years, as the fine working technique for VLSI (very large scale integration) advances, MOS transistors having a gate length of less than 0.5 μm or so are employed for SRAMs having a storage capacity of 4 Mbits or so. However, when a MOS transistor having a gate length of less than 0.5 μm or so is operated at the power source voltage of 5 V which is conventionally used, it is difficult to assure the reliability thereof against hot carriers. Therefore, an SRAM of the type mentioned is so constructed that a voltage step-down circuit is provided on a common semiconductor IC (integrated circuit) chip. The step-down circuit steps down the power source voltage of 5 V from the outside to an internal circuit voltage of, for example, 3.3 V, which is supplied to the internal circuits of the semiconductor memory device, that is, to the memory cell array and peripheral circuits.

FIG. 1 shows construction of a semiconductor memory device including a power source voltage step-down circuit. Referring to FIG. 1, peripheral circuit 7 and memory cell array 8 are interconnected by internal buses 9, and chip select terminal CS and address input terminals A0 to An are connected to peripheral circuit 7. Internal circuit voltage $V_{int}$ is supplied from voltage step-down circuit 6a to peripheral circuit 7 and memory cell array 8.

Voltage step-down circuit 6a has power source voltage input terminal TC to which external power source voltage VCC is supplied, and includes constant-current source 1a, series diode circuit D1 including two diodes connected in series, a pair of operating amplifiers 3A and 3B, a pair of resistors R1 and R2 connected in series, and P-channel MOS transistor QP1 for providing a series controlling output. It is to be noted that, in the accompanying drawings, each P-channel MOS transistor is shown circumscribed by a circle, while each N-channel MOS transistor is shown without being circumscribed by a circle.

Constant-current source 1a is supplied with external power source voltage VCC by way of voltage input terminal TC and generates constant current $I1a$. Series diode circuit D1 is connected on the anode side thereof to constant-current source 1a by way of first node N1 and is grounded on the cathode side thereof. Consequently, series diode circuit D1 is supplied with constant current $I1a$ and generates forward voltage $2 V_f$. Here $V_f$ is a forward voltage drop per one diode. Forward voltage $2 V_f$ is supplied to the "+" terminal (positive input terminal) of first operational amplifier 3A. The output signal of first operational amplifier 3A, that is, reference voltage $V_{ref}$, is divided by resistors R1 and R2 and is fed back to the "−" terminal (negative input terminal) of first operational amplifier 3A. Reference voltage $V_{ref}$ is also supplied to the "+" terminal of second operational amplifier 3B. The output of second operational amplifier 3B is connected to the gate of MOS transistor QP1, while the "−" input terminal of second operational amplifier 3B is connected to the drain of MOS transistor QP1. The source of MOS transistor QP1 is connected to power source input terminal TC so that the drain voltage of MOS transistor QP1 is supplied as internal circuit voltage $V_{int}$ to peripheral circuit 7 and memory cell array 8.

Internal circuit voltage $V_{int}$, reference voltage $V_{ref}$, forward voltage $V_f$ of each diode, and the resistances of resistors R1 and R2 have the relationship of $V_{int} = V_{ref} = 2 V_f\{(R1+R2)/R2\}$. Here, if it is assumed that, for example, $V_f = 0.5$ V, R1 = 2.3 kΩ and R2 = 1 kΩ, then internal circuit voltage $V_{int}$ is equal to reference voltage $V_{ref}$ and is 3.3 V. While peripheral circuit 7 and memory cell array 8 are constituted from MOS transistors having a gate length of 0.5 μm or so, since internal circuit voltage $V_{int}$ is, for example, 3.3 V and is sufficiently low, reliability against hot carriers can be assured.

Since a sufficiently high current driving capacity is required for P-channel MOS transistor QP1 to supply internal circuit voltage $V_{int}$, P-channel MOS transistor QP1 is designed into a MOS transistor of the dimensions, for example, of a gate length of 1.0 μm and a gate width of 1,000 μm. Meanwhile, since external power source voltage VCC is applied as is to voltage step-down circuit 6a, the gate length of the MOS transistors employed in voltage step-down circuit 6a is designed greater than 0.8 μm or so.

In power source voltage step-down circuit 6a, constant dc current $I1a$ always flows through series diode circuit D1 in order to keep the potential at first node N1 equal to $2 V_f$. Further, in order to keep reference voltage $V_{ref}$ also at second node N2 at which first and second operational amplifiers 3A and 3B are connected to each other, dc current I2 always flows through resistors R1 and R2.

Here, the construction of constant-current source 1a is described with reference to FIG. 2. Constant-current source 1a is constituted from P-channel MOS transistor QP3, series diode circuit D2 including a pair of diodes connected in series, and resistor R3. The source of MOS transistor QP3 is connected to power source input terminal TC, while the drain of MOS transistor QP3 is connected to first node N1. The anode of series diode circuit D2 is connected to power source input terminal TC, and the cathode of series diode circuit D2 is connected to the gate of MOS transistor QP3. Resistor R3 is interposed between the gate of MOS transistor QP3 and the ground. The gate-source voltage of MOS transistor QP3 is made equal to forward voltage $2 V_f$ of series diode circuit D2 so that the drain current of MOS transistor QP3 is kept to a fixed value and serves as a constant-current source. Also here, dc current I3 flows constantly through dc diode circuit D2 and resistor R3 in order to generate forward voltage 2 $V_f$.

Exemplary construction of first operational amplifier 3A is shown in FIG. 3. Referring to FIG. 3, operational amplifier 3A is constituted as a known CMOS current mirror type amplifier circuit including a pair of P-channel MOS transistors QP13 and QP14 and three N-channel MOS transistors QN18 to QN20. MOS transistors QP13 and QP14 are connected at the sources thereof to power source input terminal TC and at the gates thereof commonly to the drain of P-channel MOS transistor QP13. The drains of N-channel MOS transistors QN18 and QN19 are connected to the drains of P-channel MOS transistors QP13 and QP14, respectively, and the sources of MOS transistors QN18 and QN19 are connected commonly and are grounded by way of a channel of MOS transistor QN20. Terminals a and b are connected to the gates of MOS transistors QN18 and QN19, respectively. Terminals a and b are the "+" input terminal and the "−" input terminal, respectively, of operational amplifier 3A. External power source voltage VCC is supplied to the gate of MOS transistor QN20. The drain of the other P-channel MOS transistor QP14 is connected to output terminal C.

In operational amplifier 3A, when the potentials at input terminals a and b are higher than ground potential GND by a voltage higher than the threshold voltage of the MOS transistors, steady current I4 exists which passes through MOS transistor QN20. Also, the other operational amplifier 3B has a similar construction to operational amplifier 3A and involves a steady current.

In power source voltage step-down circuit 6a of the conventional semiconductor memory device, steady currents I1a, I2, I3 and I4 always flow, and the total of the steady currents is 100 μA or more, which is higher by two figures than the ordinary current consumption of the memory cell array.

Meanwhile, when a semiconductor memory device is constructing using a BiCMOS integrated circuit in which bipolar transistors and CMOS transistors are formed in a mixed condition, a data bus connected to a data sensing circuit is liable to have an increased length, and comparatively high parasitic capacitance CS is incidental to the data bus. Here, the data sensing circuit is a circuit provided for amplifying a data signal read out from each memory cell. In order to prevent a delay in operation after transition from the circuit waiting condition to the circuit operating condition arising from the presence of parasitic capacitance CS, a MOS transistor is provided through which bias current for keeping the potential of the data bus flows. While the MOS transistor is set so as to have a sufficiently small gate width, the bias current thereof is 1 mA or so, which is still higher than the steady currents I1a, I2, I3 and I4 described above.

As the storage capacity of a semiconductor memory device, particularly an SRAM, increases, the importance of defect analysis (analysis of causes of rejection) when the yield is decreased by various factors including fine leakage at memory cells and incomplete pattern formation progressively increases. In particular, in the defect analysis upon a decrease in yield, it is necessary to investigate various characteristics of the current consumed by the memory cell array, for example, the voltage characteristic, the temperature characteristic, the difference depending upon the write data of "0" and "1", and other factors. However, in the case of a semiconductor memory device having a power source voltage step-down circuit as described above, since a steady current higher than the current which is consumed by the memory cell array also flows through the voltage step-down circuit during waiting for circuit operation, even if the consumed current of the semiconductor memory circuit is measured simply, the current consumed by the memory cell array cannot be determined. Further, even if the power source voltage to be supplied from the outside is varied, the voltage actually applied to the memory cell array cannot be varied due to the presence of the voltage step-down circuit; consequently, the voltage characteristic of the memory cell array cannot be measured. Accordingly, it is very difficult to perform defect analysis upon decrease in yield.

SUMMARY OF THE INVENTION

It is an object of the present invention to provide a semiconductor memory device which includes a built-in power source voltage step-down circuit but can accurately measure the current consumption of the memory cell array upon operation and whose reliability is easy to evaluate.

The object of the present invention is achieved by a semiconductor memory device which includes a power source input terminal to which electric power is supplied from an external power source, a power source voltage step-down circuit connected to the power source input terminal for generating a stepped-down voltage lower than the voltage of the external power source, a memory cell array to which the stepped-down voltage is supplied, and a peripheral circuit connected to the memory cell array for receiving supply of the stepped-down voltage to perform a logic operation, characterized in that it comprises current switching means interposed in a circuit or circuits of the semiconductor memory device other than the memory cell array for performing switching of current to flow through the circuit in response to a controlling signal, and switch controlling signal generating means for generating the controlling signal in response to a signal from the outside.

The above and other objects, features and advantages of the present invention will become apparent from the following description referring to the accompanying drawings which illustrate examples of preferred embodiments of the present invention.

DETAILED DESCRIPTION OF THE PREFERRED EMBODIMENTS

Figure 1:
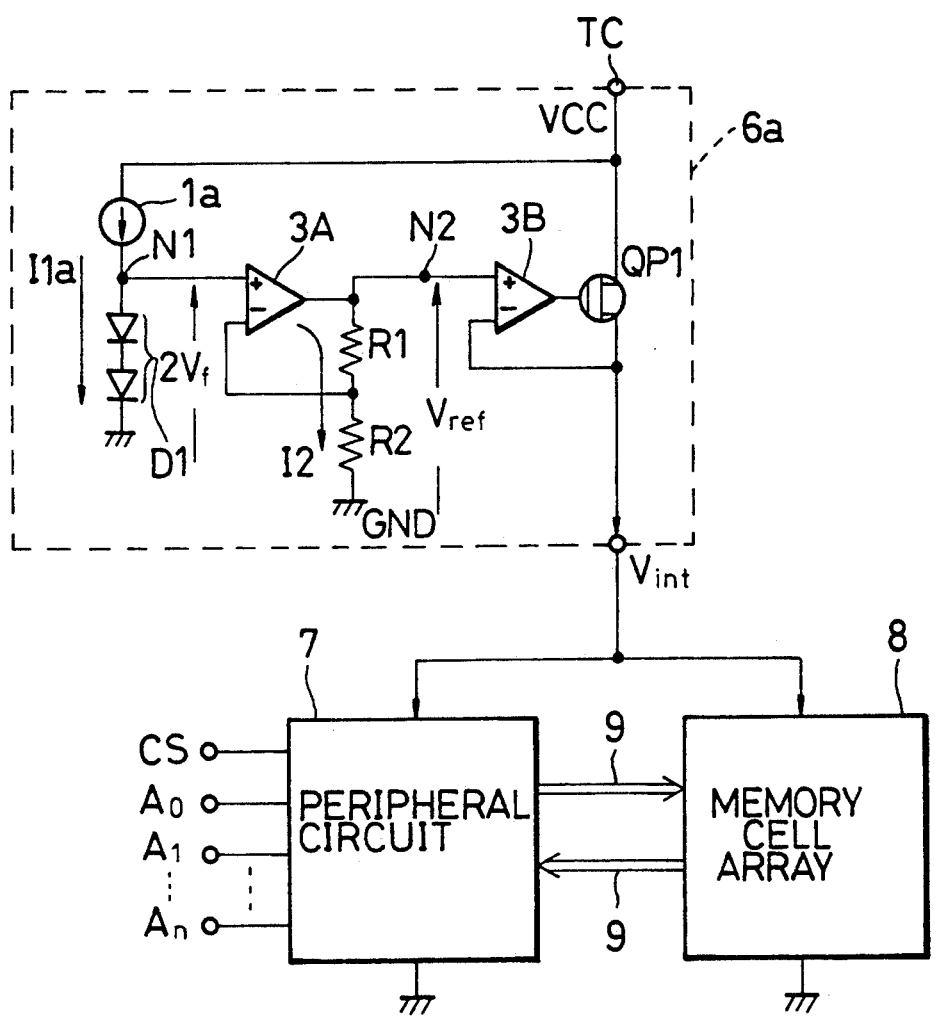
FIG. 1 is a block diagram showing construction of a conventional semiconductor memory device.

The first preferred embodiment of the present invention is described with reference to the drawings. Referring to FIGS. 4 to 7 in which the semiconductor memory device of the present embodiment is shown, the functional blocks in FIGS. 4 to 7 which are denoted by the same reference numerals and characters as those of FIGS. 1 and 2 have the same functions.

Figure 2:
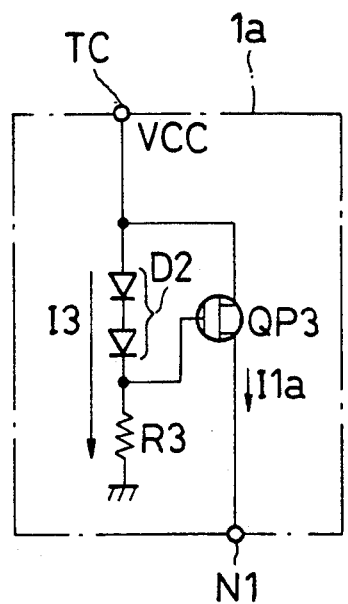
FIG. 2 is a circuit diagram showing construction of the constant-current source of the semiconductor memory device of FIG. 1.
Figure 4:
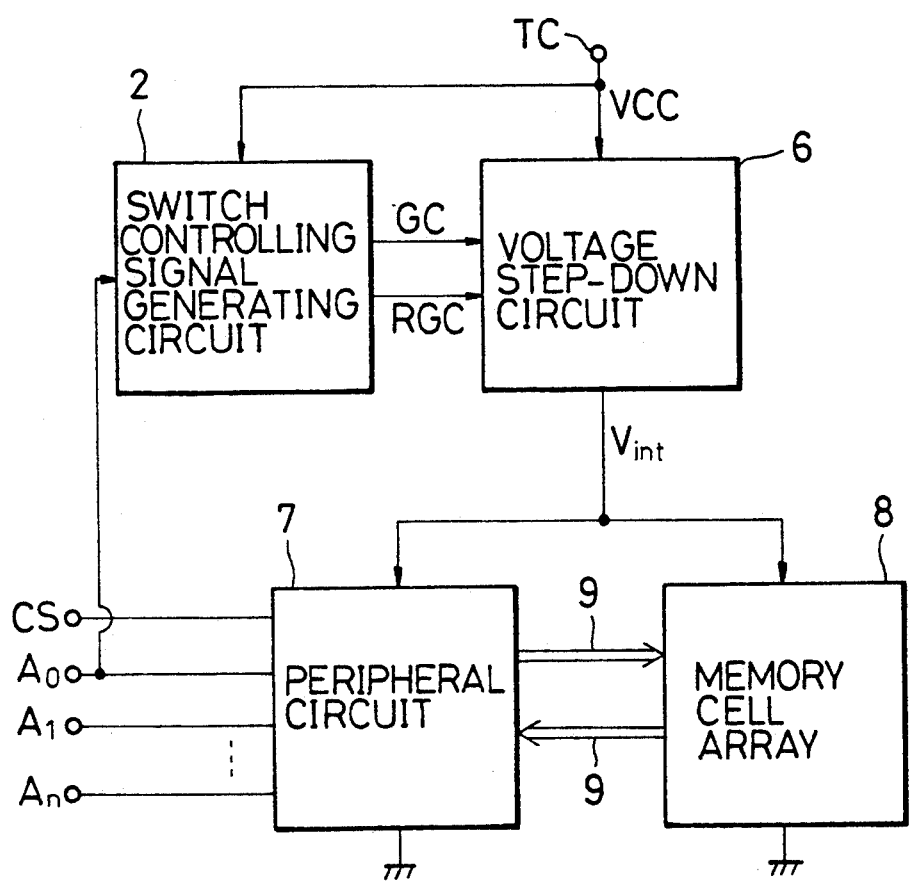
FIG. 4 is a block diagram showing construction of the semiconductor memory device of the first preferred embodiment of the present invention.

The semiconductor memory device of the present embodiment shown in FIG. 4 includes switch controlling signal generating circuit 2 in addition to the conventional semiconductor memory device shown in FIG. 1 and includes, in place of power source voltage step-down circuit 6a, power source voltage step-down circuit 6 which is controlled by switch controlling signals GC and RGC. More particularly, the semiconductor memory device includes switch controlling signal generating circuit 2 supplied with external power source voltage VCC for producing switch controlling signal GC and reverse controlling signal RGC, peripheral circuit 7, memory cell array 8, and voltage step-down circuit 6 for supplying internal circuit voltage $V_{int}$ to peripheral circuit 7 and memory cell array 8.

Figure 5:
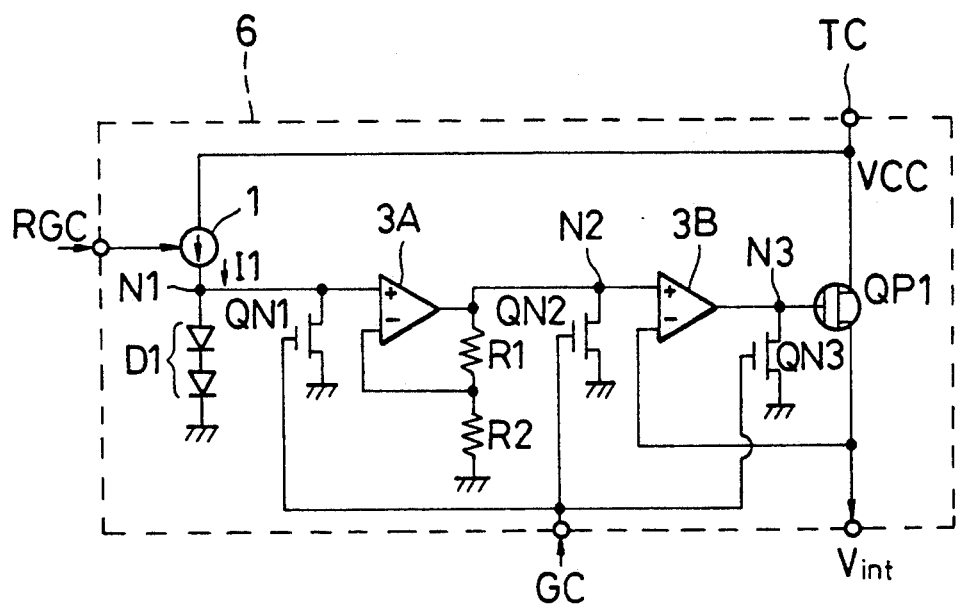
FIG. 5 is a circuit diagram showing construction of the power source voltage step-down circuit of the semiconductor memory device of FIG. 4.

Detailed construction of power source voltage step-down circuit 6 is described subsequently with reference to FIG. 5. Voltage step-down circuit 6 is a modification of voltage step-down circuit 6a of the conventional semiconductor memory device shown in FIG. 1, in that constant-current source 1 which is controlled by reverse controlling signal RGC replaces constant-current source 1a, and three N-channel MOS transistors QN1 to QN3 for on/off switching are additionally provided. MOS transistors QN1 to QN3 are interposed between first node N1 and the ground, between second node N2 and the ground, and between the gate of MOS transistor QP1 and the ground, respectively. Here, the junction between the output of second operational amplifier 3B and MOS transistor QP1 is hereinafter referred to as third node N3. The gates of MOS transistors QN1 to QN3 are connected commonly so that switch controlling signal GC may be applied thereto.

Figure 6:
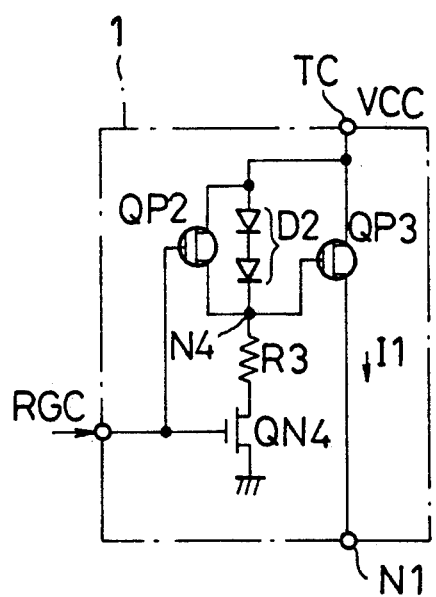
FIG. 6 is a circuit diagram showing construction of the constant-current source of the semiconductor memory device of FIG. 4.

Constant-current source 1 is described with reference to FIG. 6. Constant-current source 1 is a modification of conventional constant-current source 1a described above with reference to FIG. 2, in that P-channel MOS transistor QP2 is additionally provided in parallel to series diode circuit D2, and N-channel MOS transistor QN4 is additionally interposed between resistor R3 and the ground. Reverse controlling signal RGC from switch controlling signal generating circuit 2 is supplied to the gates of additionally provided MOS transistors QP2 and QN4.

Here, construction of switch controlling signal generating circuit 2 is described with reference to FIG. 7. Switch controlling signal generating circuit 2 is constituted from series diode circuit D3 including three diodes connected in series, four P-channel MOS transistors QP5 to QP8, and four N-channel MOS transistors QN5 to QN8. A known three-stage CMOS inverter is constituted from six transistors QP6 to QP8 and QN6 to QN8. The sources of transistors QP6 to QP8 are connected commonly and connected to power source input terminal TC. The sources of transistors QN6 to QN8 are grounded. The gates of transistors QP6 and QN6 are connected to node N6. The drains of transistors QP6 and QN6 and the gates of transistors QP7 and QN7 are connected commonly at node N7. The drains of transistors QP7 and QN7 and the gates of transistors QP8 and QN8 are connected commonly and further connected to terminal TGC for outputting controlling signal GC. The drains of transistors QP8 and QN8 are connected commonly and connected to terminal TRGC for outputting reverse controlling signal RGC.

The anode of series diode circuit D3 is connected to a terminal which is not used when the current consumption of the memory cell array is to be measured. In the arrangement shown in FIGS. 4 and 7, the anode is connected to address input terminal $A_0$, but it may otherwise be connected to any other terminal than address input terminal $A_0$. The cathode of series diode circuit D3 is connected to the source of P-channel MOS transistor QP5 by way of node N5. The drain of transistor QP5 is connected commonly at node N6 to the drain of N-channel MOS transistor QN5. The source of transistor QN5 is grounded. External power source voltage VCC is supplied to the gates of transistors QP5 and QN5 by way of power source input terminal TC.

Next, operation of the semiconductor memory device is described. It is assumed that external power source voltage VCC when the semiconductor memory device performs ordinary operation is 5 V as in most semiconductor memory devices on the market.

When the semiconductor memory device is in an ordinary operating condition (a reading condition or a writing condition) or in a waiting condition, the potential at address input terminal $A_0$ is equal to a particular potential between external power source voltage VCC and ground potential GND. Here, in order to enter a mode (hereinafter referred to as check mode) in which current consumption upon operation of the memory cell array is to be measured, the potential at address input terminal $A_0$ is set to a voltage higher by 3 V or so than external power source voltage VCC. For example, when power source voltage VCC is 5 V, a voltage of 8 V is applied to input terminal $A_0$. Since series diode circuit D3 consists of three diodes, where the forward voltage drop of each diode is represented by $V_f$, the forward voltage drop of series diode circuit D3 is given as $3 V_f$. In this instance, the potential at node N5 is equal to a value lower by $3 V_f$ than 8 V, that is, when $V_f$ is, for example, 0.5 V to the value of $(8-3\times0.5)=6.5$ V. Here, if it is assumed that the absolute value of the threshold voltage level of P-channel MOS transistor QP5 is 0.7 V, the gate-source voltage of transistor QP5, that is, the voltage of 1.5 V which is the difference between the potential at node N5 and power source voltage VCC, is higher than the absolute value of the threshold voltage level, and consequently, transistor QP5 is put into an on-state.

If the gate width dimension of P-channel MOS transistor QP5 is designed to a sufficiently high value, for example, to 100 times, with respect to that of N-channel MOS transistor QN5, then when P-channel MOS transistor QP5 is put into an on-state as described above, the potential at node N6 is raised to a level substantially equal to the potential at node N5, that is to 6.5 V or so. Consequently, N-channel MOS transistor QN6 at the following stage is put into an on-stage so that the level at node N7 is changed from the "H" to the "L" level. Similarly, switch controlling signal GC which is the output signal of the next stage is changed from the "L" level to the "H" level; further, reverse controlling signal RGC is changed from the "H" level to the "L" level. On the other hand, in an ordinary case, that is, in the case where the potential at input terminal $A_0$ is lower than power source voltage VCC, since transistor QP5 remains in an off-state, the potential at node N6 is maintained at the "L" level, controlling signal GC at the "L" level, and reverse controlling signal RGC at the "H" level.

From the foregoing, it can be seen that, if a voltage higher than the 5 V of the power source voltage, for example, 8 V, is applied to input terminal $A_0$, signal GC is changed to the "H" level while signal RGC is changed to the "L" level. In other words, when 8 V is applied, switch controlling signals GC and RGC present "H" and "L" levels, respectively, thereby setting a current check mode for memory operation.

Subsequently, operation of power source voltage step-down circuit 6 when a check mode is set is described. Since reverse controlling signal RGC received by constant-current source 1 is changed to the "L" level, transistor QN4 is turned off while transistor QP2 is turned on; consequently, the steady current flowing through resistor R3 is cut. Meanwhile, since the potential at node N4 becomes substantially equal to external power source voltage VCC, the gate-source voltage of transistor QP3 becomes substantially equal to 0 V; also, constant-current transistor QP3 is turned off. Consequently, current I1 flowing through transistor QP3 is almost cut. In this instance, steady currents I1a and I3, as at constant-current source 1a shown in FIG. 2, flow very little.

Figure 3:
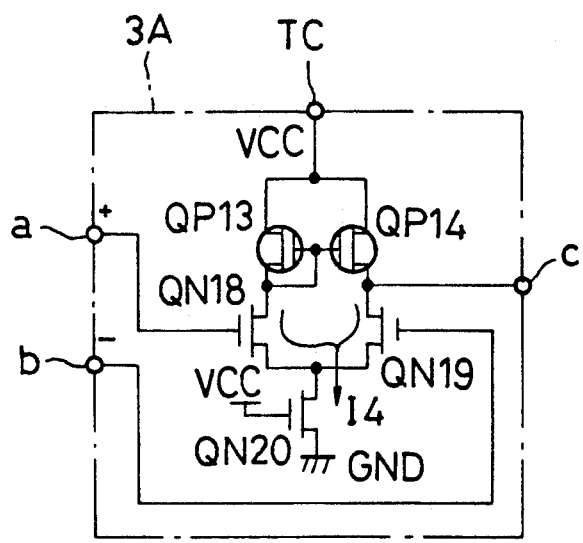
FIG. 3 is a block diagram showing construction of the operational amplifier of the semiconductor memory device of FIG. 1.

Since switch controlling signal GC is changed to the "H" level then, the gate voltages of N-channel MOS transistors QN1 to QN3 of voltage step-down circuit 6 are changed to the "H" level and are put into an on-state. Consequently, the potentials at nodes N1 to N3 become equal to the "L" level, that is, substantially equal to the ground potential. As a result, transistor QN18 (FIG. 3) of operational amplifier 3A is turned off, and mirror transistors QP13 and QP14 are also turned off. Consequently, steady current I4 flowing through operational amplifier 3A is cut. Similarly, steady current is cut also in the other operational amplifier 3B.

As described to this point, with the semiconductor memory device of the present embodiment, all steady currents flowing through power source voltage step-down circuit 6 are cut by setting the check mode. Since node N3 is at the "L" level when the semiconductor memory device is in the check mode, P-channel MOS transistor QP1 is in a conducting state, and external power source voltage VCC is applied as internal circuit voltage $V_{int}$ to peripheral circuit 7 and memory cell array 8. Accordingly, when causes of rejection of memory cell array 8 are analyzed, current consumption, that is, current flowing to power source input terminal TC, should be measured suitably varying external power source voltage VCC, while the requirement that the voltage at input terminal $A_0$ is higher by, for example, 3 V than external power source voltage VCC is maintained. Since the operating current of memory cell array 8 can be measured accurately in this manner, an analysis of various causes of rejection can be made readily.

On the other hand, when the semiconductor memory device is not in the check mode, that is, when the semiconductor memory device is in an ordinary condition, switch controlling signal GC presents the "L" level while reverse controlling signal RGC presents the "H" level. In this condition, transistor QP2 of constant-current source 1 is in the off-state while transistor QN4 is in the on-state, and N-channel MOS transistors QN1 to QN3 are in the off-state. Accordingly, power source voltage step-down circuit 6 operates quite similarly to conventional voltage step-down circuit 6a shown in FIG. 1, and reading, writing or waiting operations of the semiconductor memory device is performed regularly.

While the first preferred embodiment of the present invention is described so far, the present invention can be embodied in various forms. For example, in switch controlling signal generating circuit 2 shown in FIG. 6, the check mode is established in accordance with a voltage applied to address input terminal $A_0$. This is because a package of a semiconductor memory device generally does not have an input or output pin which is not used. If a package of a semiconductor memory device has an unused input or output pin, that is, an input or output pin which is not electrically connected to the internal circuit of the package, the input or output pin can be used for setting the check mode. An exemplary switch controlling signal generating circuit wherein an unconnected surplus pin is utilized for setting the check mode is shown in FIG. 8.

Figure 7:
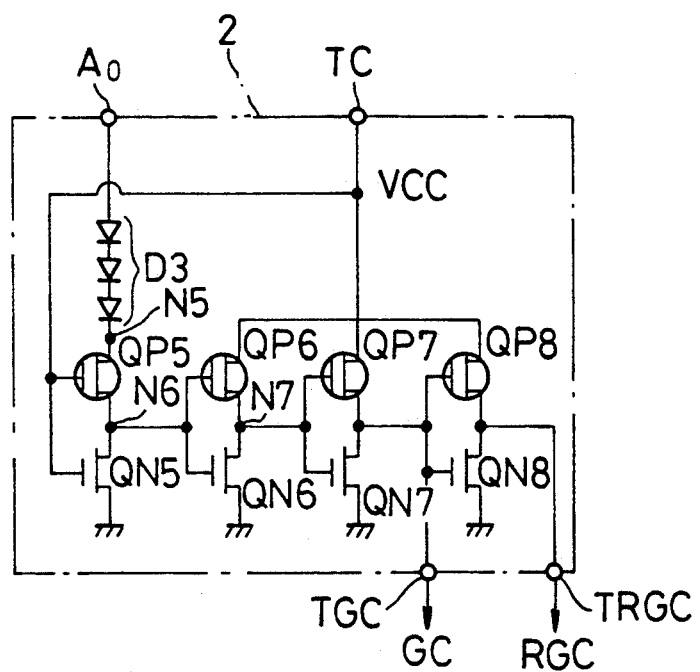
FIG. 7 is a circuit diagram showing construction of the switch controlling signal generating circuit of the semiconductor memory device of FIG. 4.
Figure 8:
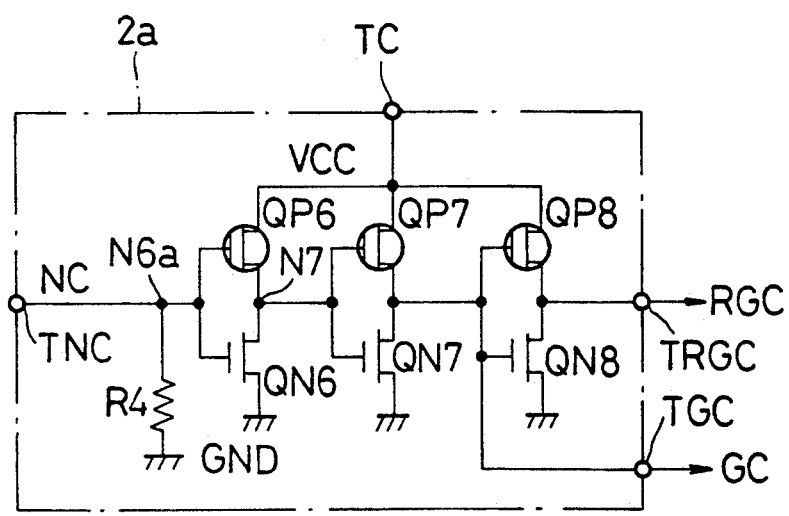
FIG. 8 is a circuit diagram showing an alternative construction of the switch controlling signal generating circuit.

Referring to FIG. 8 which shows switch controlling signal generating circuit 2a, the functional blocks denoted by the same reference characters as those of FIG. 7 have the same functions to those shown in FIG. 7. Switch controlling signal generating circuit 2a is a modification of controlling signal generating circuit 2 shown in FIG. 7 in that it precludes series diode circuit D3, P-channel MOS transistor QP5, and N-channel MOS transistor QN5. Instead, the gates of transistors QP6 and QN6 and input/output pin TNC are connected commonly at node N6a. Input/output pin TNC is an unused pin such as described above, but is used instead to set the check mode. Further, resistor R4 is additionally interposed between node N6a and the ground.

Operation of switch controlling signal generating circuit 2a is next described. When the level at input/output pin TNC is changed to the "H" level, the level at node N7 is changed to the "L" level by an inverter circuit consisting of transistors QP6 and QN6, and the level at terminal TGC is changed to the "H" level while the level at terminal TRGC is changed to the "L" level. In other words, controlling signal GC is changed to the "H" level and reverse controlling signal RGC is changed to the "L" level, whereby the check mode is established. On the contrary, when the level at input/output pin TNC is changed to the "L" level, the level at node N7 is changed to the "H" level and controlling signal GC is changed to the "L" level while reverse controlling signal RGC is changed to the "H" level, whereby an ordinary operating mode is established. It is to be noted that, since resistor R4 is interposed between node N6a and the ground, when input/output pin TNC is put into a floating state, the level at node N6a is changed to the "L" level; consequently, a check mode being established in error due to noise or some other factors is prevented. Accordingly, with the semiconductor memory device provided with switch controlling signal generating circuit 2a, when an ordinary operation is to be performed, the level at input/output pin TNC should be set to the "L" level, but only when a check mode is to be entered, the level at input/output pin TNC should be set to the "H" level. Thus, an analysis of causes of rejection of the memory cell array can be made readily.

Next, the semiconductor memory device of another preferred embodiment of the present invention is described with reference to FIG. 9. The semiconductor memory device is so constructed that steady currents which flow through a data sensing circuit and a data bus in the waiting condition can be cut when it is in the check mode.

Each memory cell is connected to one of a plurality of data line pairs BL/RBL, and each data line pair BL/RBL is composed of two data lines BL and RBL. Each data line pair BL/RBL is connected at one end thereof commonly to data line pair DB/RDB, which consists of a pair of data buses, by way of one of corresponding transfer gates $TG_0, \ldots, TG_i$ individually provided for data line pairs BL/RBL. Each transfer gate $TG_0$ to $TG_i$ is constituted from a pair of P-channel MOS transistors QP9 and QP10 corresponding to data lines BL and RBL, respectively. Address decode signals $Y_0$ to $Y_i$ are inputted to both gates of MOS transistors QP9 and QP10 corresponding to individual transfer gates $TG_0$ to $TG_i$, respectively. When only one of address decode signals $Y_0$ to $Y_i$ is put into the "L" level, the transfer gate corresponding to the address decode signal which has been put into the "L" level is put into the on-state so that data on the bit line pair BL/RBL corresponding to the address decode signal are transmitted to data line pair DL/RDL.

Differential sensing amplifier $4_0$ for amplifying a data signal with minute amplitude appearing on the data line pair DL/RDL is provided at one end of data line pair DL/RDL. Differential sensing amplifier $4_0$ is constituted from a pair of NPN bipolar transistors B1 and B2 whose emitters are connected commonly at junction CE, and from six N-channel MOS transistors QN9 to QN14. The bases of bipolar transistors B1 and B2 are connected to data lines DL and RDL, respectively. MOS transistors QN9 and QN12 are connected in parallel between the base of bipolar transistor B1 and the ground, MOS transistors QN10 and QN13 are connected in parallel between junction CE and the ground, and MOS transistors QN11 and QN14 are connected in parallel between the base of the other bipolar transistor B2 and the ground. Signal $BS_0$, which is a kind of address signal for selecting differential sensing amplifier $4_0$, is inputted to the gates of MOS transistors QN9 to QN11. Reverse controlling signal RGC is inputted to the gates of MOS transistors QN12 to QN14. The collectors of bipolar transistors B1 and B2 are connected to data load lines LL and RLL, respectively, which are in turn connected to sensing load 5.

Data lines DL and RDL are each accompanied by floating capacitance CS and are connected to power source input terminal TC by way of P-channel MOS transistors QP11 and QP12, respectively, in order to obtain bias currents. Switch controlling signal GC is inputted to the gates of MOS transistors QP11 and QP12.

A plurality of differential data sensing amplifiers $4_0, \ldots, 4_i$ are connected to data load lines LL and RLL. Signals $BS_0, \ldots, BS_i$ for selecting one of particular differential data sensing amplifiers $4_0, \ldots, 4_i$ are inputted to differential data sensing amplifiers $4_0, \ldots, 4_i$, respectively, and reverse controlling signal RGC is inputted commonly to differential data sensing amplifiers $4_0, \ldots, 4_i$.

Sensing load 5 is constituted from two NPN bipolar transistors B3 and B4 whose bases are connected commonly at junction CB, from two resistors R5 and R6, and from diode D4. The emitters of transistors B3 and B4 are connected to data load lines LL and RLL, respectively. The collectors of transistors B3 and B4 are connected to power source input terminal TC by way of resistors R5 and R6, respectively. The anode of diode D4 is connected to power source input terminal TC, while the cathode of diode D4 is connected to junction CB. The collector of transistor B3 is connected to output terminal ROUT so that a data signal read out from a memory cell and amplified by a differential data sensing amplifier and the sensing load 5 may be outputted therefrom.

The semiconductor memory device further includes three N-channel MOS transistors QN15 to QN17 to the gates of which reverse controlling signal RGC is supplied. Transistors QN15 and QN17 interconnect data load lines LL and RLL and the ground, respectively. Transistor QN16 interconnects junction CB and the ground.

Figure 9:
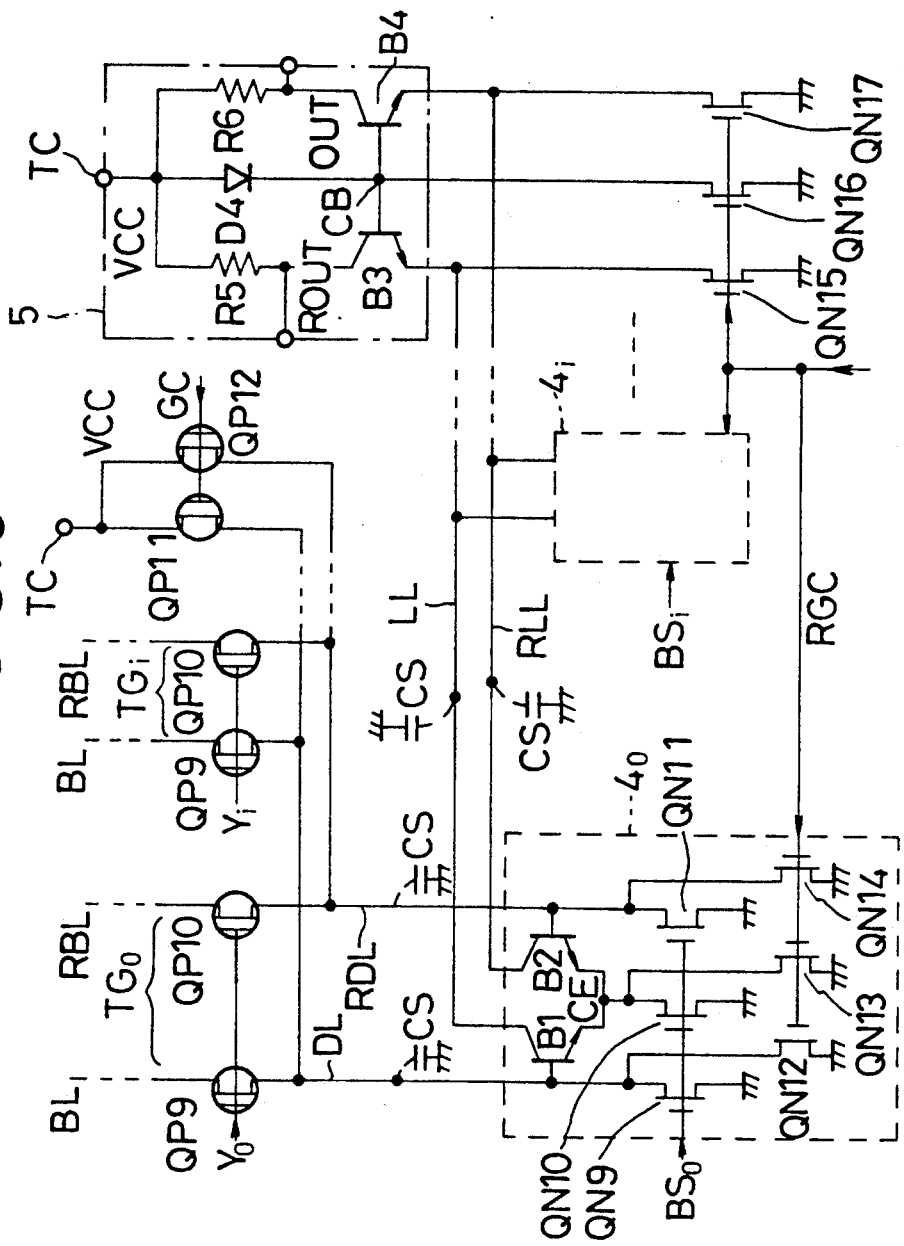
FIG. 9 is a block diagram showing construction of the semiconductor memory device of another preferred embodiment of the present invention.

In the semiconductor memory device shown in FIG. 9, controlling signal GC and reverse controlling signal RGC are supplied to the gates of transistors QP11, QP12 and QN12 to QN17, respectively. Controlling signal GC and reverse controlling signal RGC can be produced from the switch controlling signal generating circuit shown in FIG. 7 or FIG. 8. Here, differences between this semiconductor memory device and a conventional semiconductor memory device are described. A conventional semiconductor memory device also involves elements corresponding to transistors QP11, QP12 and QN12 to QN17. However, while the gates of the transistors QP11 and QP12 of the device of the present embodiment are connected to controlling signal GC, the gates of the corresponding transistors in the conventional memory device are grounded. Further, while reverse controlling signal RGC is inputted to the gates of transistors QN12 to QN17 of the device of the present embodiment, external power source voltage VCC is supplied to the corresponding gates of the conventional device.

Next, operation of the semiconductor memory device is described. When the semiconductor memory device is in the ordinary operating condition, that is, when it is not in the check mode, controlling signal GC supplied from the switch controlling signal generating circuit presents the "L" level while reverse controlling signal RGC presents the "H" level; consequently, transistors QP11, QP12 and QN12 to QN17 are all in an on-state. Accordingly, data line pairs DL/RDL and data load lines LL/RLL are placed in a low impedance state and maintain a stable potential. In this condition, the semiconductor memory device operates in a similar manner to the conventional semiconductor memory device. In particular, data read out from memory cells appear on bit line pairs BL/RBL. Data on bit line pair BL/RBL selected in accordance with an address decode signal are transferred to data lines DL and RDL by way of transistors QP9 and QP10, amplified by a differential data sensing amplifier and sent out onto data load lines LL and RLL. Then, the data are outputted as a data signal by way of sensing load 5. In this instance, the differential data sensing amplifiers are controlled in accordance with block select signals $BS_0, \ldots, BS_i$ so that only one of the differential data sensing amplifiers corresponding to the block select signal which has been selected and put into the "H" level state is activated. It is to be noted that, in this instance, steady currents flowing from power source input terminal TC side to the ground side are present in differential data sensing amplifiers $4_0, \ldots, 4_i$ and sensing load 5.

Subsequently, operation of the semiconductor memory device in the check mode is described. In this instance, controlling signal GC from the switch controlling signal generating circuit represents the "H" level while reverse controlling signal RGC represents the "L" level. As a result, all of transistors QP11, QP12 and QN12 to QN17 are in an off-state; consequently, steady currents flowing through differential data sensing amplifiers $4_0, \ldots, 4_i$ and sensing load 5 are all cut. Accordingly, in this condition, it can be assumed that current from power source input terminal TC flows only through the memory cell array, and an analysis of causes of rejection of the semiconductor memory device can be performed readily.

It is to be understood that variations and modifications of the semiconductor memory device disclosed herein will be evident to those skilled in the art. It is intended that all such modifications and variations be included within the scope of the appended claims.

What is claimed is:

1. In a semiconductor memory device which includes a power source input terminal to which electric power is supplied from an external power source, a power source voltage step-down circuit connected to said power source input terminal for generating a stepped-down voltage lower than the voltage of the external power source, a memory cell array to which the stepped-down voltage is supplied, and a peripheral circuit connected to said memory cell array for receiving supply of the stepped-down voltage to perform a logic operation, the improvement which comprises:

current switching means attached to at least one of a plurality of circuit blocks for switching of current flowing through said at least one circuit block in response to a controlling signal, such that current consumption in said memory cell array during operation may be accurately measured, said plurality of circuit blocks comprising said power source voltage step-down circuit and said peripheral circuit; and switch controlling signal generating means for generating said controlling signal in response to a signal from the outside.

2. A semiconductor memory device as claimed in claim 1, wherein said current switching means comprises at least one transistor.

3. A semiconductor memory device as claimed in claim 2, wherein said semiconductor device comprises a plurality of said current switching means.

4. In a semiconductor memory device which includes a power source input terminal to which electric power is supplied from an external power source, a power source voltage step-down circuit connected to said power source input terminal for generating a stepped-down voltage lower than the voltage of the external power source, a memory cell array to which the stepped-down voltage is supplied, and a peripheral circuit connected to said memory cell array for receiving sup-ply of the stepped-down voltage to perform a logic operation, the improvement which comprises:

current switching means attached to at least one of a plurality of circuit blocks for performing switching of current flowing through said at least one circuit block in response to a controlling signal, such that current consumption in said memory cell array in operation may be accurately measured, said plurality of circuit blocks comprising said power source voltage step-down circuit and said peripheral circuit; and switch controlling signal generating means for generating said controlling signal in response to a signal from the outside, said current switching means comprising at least one transistor, said semiconductor memory device comprising a plurality of said current switching means, and said switch controlling signal generating means generating first and second controlling signals the phases of which are reverse to each other.

5. A semiconductor memory device as claimed in claim 4, wherein said switch controlling signal generating means is connected to a data inputting pin of said semiconductor memory device and generates the controlling signals in response to the potential at said data inputting pin which becomes equal to a predetermined potential higher than the voltage of the external power source.

6. A semiconductor memory device as claimed in claim 4, wherein said power source voltage step-down circuit includes a constant voltage-difference generating means, a constant-current source for supplying constant current to said constant voltage-difference generating means, a series controlling output transistor having one end connected to said power source inputting terminal for producing the stepped-down voltage, and an amplifier for comparing the voltage at the other end of said series controlling output transistor and the output voltage of said constant voltage-difference generating means to control said series controlling output transistor, said current switching means being provided in said constant-current source and at the input end of said amplifier in said power source voltage step-down circuit.

7. A semiconductor memory device as claimed in claim 6, wherein said amplifier includes a current mirror type differential amplifying circuit.

8. A semiconductor memory device as claimed in claim 4, wherein a memory cell of said memory cell array is connected to a differential sensing amplifier by way of a data bus, and said current switching means are provided at positions at which said power source input terminal and said data bus are connected to each other and in the inside of said differential sensing amplifier.

* * * * *

UNITED STATES PATENT AND TRADEMARK OFFICE
CERTIFICATE OF CORRECTION

PATENT NO. : 5,327,388

DATED : July 5, 1994

INVENTOR(S) : Yasuo Kobayashi

It is certified that error appears in the above-identified patent and that said Letters Patent is hereby corrected as shown below:

Title page, item [57],
Abstract, line 11, delete "device", insert --means--.

Signed and Sealed this

Fourteenth Day of February, 1995

Attest:

Attesting Officer

BRUCE LEHMAN

Commissioner of Patents and Trademarks